United States Patent [19]

Yonezawa et al.

[11] 4,155,802

[45] May 22, 1979

[54] METHOD OF PRODUCING SEMICONDUCTOR DEVICE INVOLVING THE USE OF SILICON NITRIDE AS AN OXIDATION MASK

[75] Inventors: Toshio Yonezawa, Yokosuka; Hidekuni Ishida; Shunichi Hiraki, both of Yokohama; Shoichi Kitane, Himeji, all of Japan

[73] Assignee: Tokyo Shibaura Electric Co., Ltd., Tokyo, Japan

[21] Appl. No.: 746,898

[22] Filed: Dec. 2, 1976

[30] Foreign Application Priority Data

Dec. 3, 1975 [JP] Japan .................................. 50-144255

[51] Int. Cl.² .................. H01L 21/318; H01L 21/308; H01L 21/32
[52] U.S. Cl. ................................. 156/653; 148/175; 156/657; 427/85; 427/94; 427/399
[58] Field of Search .................. 427/94, 85, 399; 156/653, 657, 659; 148/175

[56] References Cited

U.S. PATENT DOCUMENTS

| | | | |
|---|---|---|---|
| 3,632,433 | 1/1972 | Toruyama et al. ................ | 427/93 |
| 3,648,125 | 3/1972 | Peltzer ................................ | 148/187 X |
| 3,649,886 | 3/1972 | Kooi .................................... | 427/94 |
| 3,652,324 | 3/1972 | Chu et al. .......................... | 427/94 |
| 3,759,761 | 9/1973 | Mori et al. ........................ | 156/657 |
| 3,764,423 | 10/1973 | Hauser et al. ................... | 156/653 |
| 3,798,062 | 3/1974 | Mroczeck et al. ............... | 427/94 |
| 3,874,919 | 4/1975 | Lehman ........................... | 427/94 X |
| 3,900,350 | 8/1975 | Appels et al. ................... | 427/94 |
| 3,917,495 | 11/1975 | Horn ................................. | 427/85 |
| 3,925,120 | 12/1975 | Saida et al. ...................... | 156/653 |
| 3,958,040 | 5/1976 | Webb ................................ | 427/94 |
| 4,091,169 | 5/1978 | Bohg et al. ...................... | 427/94 X |

OTHER PUBLICATIONS

Shasteen "Recessed Oxide Isolation Technique" IBM Tech. Disc. Bul. vol. 19, No. 10 3/77 p. 3672.
Appels et al. "Local Oxidation of Silicon and its Application in Semiconductor Device Technology" Phillips Res. Rep., vol. 25, No. 2, Apr. 1970 pp. 118-132.

*Primary Examiner*—Harris A. Pitlick
*Attorney, Agent, or Firm*—Finnegan, Henderson, Farabow and Garrett

[57] ABSTRACT

A method of producing a semiconductor device comprises removing all of the masking films used for forming desired semiconductor regions in the substrate, newly forming an insulation film and selectively forming a second insulation film at predetermined portions by the use of a silicon nitride film as the mask.

18 Claims, 11 Drawing Figures

METHOD OF PRODUCING SEMICONDUCTOR DEVICE INVOLVING THE USE OF SILICON NITRIDE AS AN OXIDATION MASK

This invention relates to a method of producing a semiconductor device, and more particularly, to a method of producing a semiconductor device low in noise generation and high in withstand voltage.

As known well, semiconductor devices such as transistors, diodes, integrated circuits and thyristors are produced through various processes including an epitaxial layer formation on the surface of a semiconductor substrate, a masking film formation, impurities doping, an insulation film formation, photo-etching, a metal deposition, an electrode formation, etc. In the production of, for example, an IC transistor, an epitaxial layer is formed first on a semiconductor substrate such as a silicon substrate having a buried layer formed in advance, followed by forming a masking film made of, in general, silicon dioxide. Then, predetermined portions of the masking film are removed by photo-etching and desired impurities are doped to form isolation regions. The processes of silicon dioxide masking film formation and the photo-etching are repeated to dope base impurities and, then, to dope emitter impurities. Finally, a silicon dioxide insulation film is formed, followed by metal deposition and the subsequent photo-etching of the metal layer for the electrode mounting and the wiring purpose, thereby producing an IC transistor.

Silicon dioxide film acts as both a masking film and an insulation film, and accordingly, the semiconductor device produced by the prior method retains the silicon dioxide films used as a mask in the production step. It is important to note that the masking films have been subjected to heat treatment several times in the production of the semiconductor device. It follows that the masking films inevitably contain a considerable amount of undesired alkali metal impurities, typically sodium ions, coming mainly from a heat-distribution tube used in the heating step, etc. The undesired impurities mentioned tend to form channels in the collector region and the base region of the product semiconductor device, leading to the flow of a large amount of generation-recombination current. As a result, the 1/f noise is increased and the withstand voltages between the collector and the base and between the collector and the emitter are lowered.

An object of this invention is to provide a method of producing a semiconductor device which is less likely to be influenced by undesired impurities.

Another object is to provide a method of producing a semiconductor device low in noise generation and high in withstand voltage.

These and other objects which will be apparent from the following description are attained by a method of producing a semiconductor device comprising removing all of the masking films used in one or more preceding steps of forming desired semiconductor regions within a semiconductor substrate to expose the entire surface of the semiconductor substrate; forming a first insulation film on the exposed surface of the semiconductor substrate; selectively forming a silicon nitride film on the surface of the first insulation film to provide covered and uncovered portions of the first insulation film on predetermined locations of the first insulation film; and forming a second insulation film selectively on the uncovered portions of the first insulation film using the silicon nitride film as a mask.

This invention will be more fully understood from the following detailed description when taken in conjunction with the appended drawings in which.

Figure 1A:
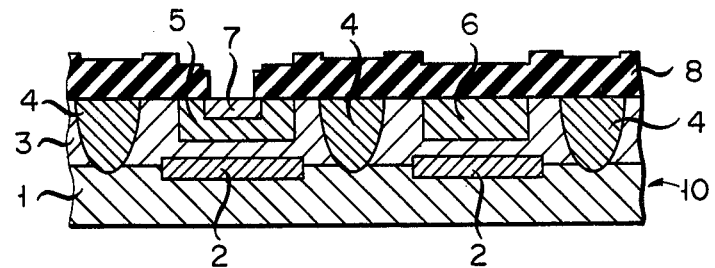
FIGS. 1A to 1I are sectional views showing the steps of forming a semiconductor device in accordance with one embodiment of this invention.

Described below is one embodiment of this invention. FIG. 1A shows a portion 10 for an IC device having desired impurity regions formed by ordinary processes. Specifically the portion 10 is formed as follows. First, an N-type epitaxial layer 3 is formed on a silicon wafer 1 having N+ buried layers 2 formed therein. Then, a silicon dioxide film is formed by oxidation on the epitaxial layer 3 and selectively removed by photo-etching to provide a mask and P-type impurities are doped into the epitaxial layer 3 to form isolation regions 4. Those processes of silicon dioxide film formation and photo-etching are repeated and P-type impurities are doped to form a base region 5 and, at the same time, to form a resistance region 6. Further, the formation of a silicon dioxide film and photo-etching are repeated and N-type impurities are doped to form an emitter region 7. Thus is obtained the portion 10 for an IC device having a silicon dioxide film 8 consisting of the masks used in the impurity doping steps and formed on the surface of the epitaxial layer 3 as shown in FIG. 1A.

Figure 1B:
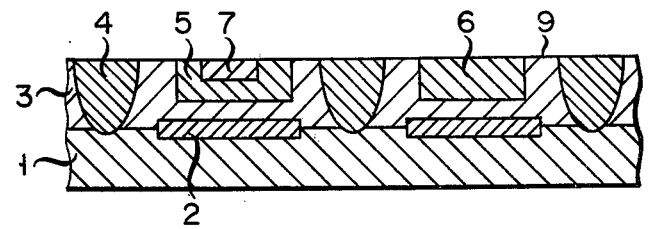

According to this invention, the masking film 8 is entirely removed by an etching solution, such as a mixture of hydrochloric acid, sulfuric acid and acetic acid or a diluted hydrofluoric acid, or by plasma etching which uses tetrafluoromethane or the like, so as to expose the entire semiconductor substrate surface 9 as shown in FIG. 1B. Incidentally, the "semiconductor substrate" mentioned refers to the portion, such as epitaxial layer 3 or silicon wafer, having a surface on which an insulation film is to be finally formed.

Figure 1C:
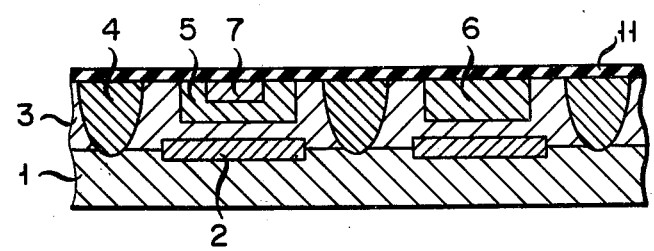

A first insulation film 11 is newly formed on the exposed semiconductor substrate surface 9 as shown in FIG. 1C. It is preferred that the film 11 be formed of the silicon dioxide ($SiO_2$) obtained by oxidation of the substrate caused by heating thereof in a mixed gas stream containing hydrogen gas, oxygen gas and a gas of a halogen-containing compound such as hydrogen chloride or trichloroethylene. Usually, the heating is effected at about 1000° C. for about 30 minutes, thereby forming a silicon dioxide film having a thickness of about 1500 Å. The oxide film thus obtained is markedly low in pin hole occurrences and does not contain sodium ion at all. Therefore, the base region or the collector region covered by the insulation film 11 is very unlikely to invite channel generation.

Figure 1D:
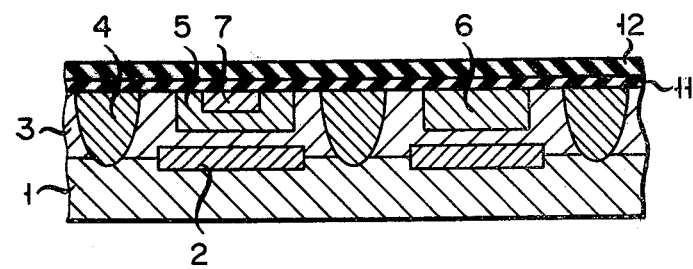

A silicon nitride ($Si_3N_4$) film 12 is then formed over the entire surface of the insulation film 11 as shown in FIG. 1D. The silicon nitride film 12 is formed by chemical vapor deposition utilizing the reaction between monosilane and ammonia as shown below:

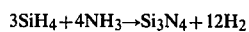

$$3SiH_4 + 4NH_3 \rightarrow Si_3N_4 + 12H_2$$

Generally, the silicon nitride film 12 is about 1000 Å thick.

Figure 1E:
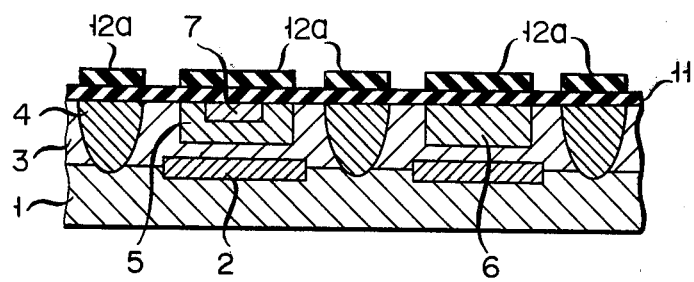

The silicon nitride film 12 thus formed is selectively removed by photo-etching using phosphoric acid or by plasma etching using tetrafluoromethane (CF$_4$) so as to provide a silicon nitride film 12a selectively on those portions of the insulation film 11 below which are formed the isolation regions 4, the base region 5, the emitter region 7 and the resistance region 6, as shown in FIG. 1E.

Figure 1F:
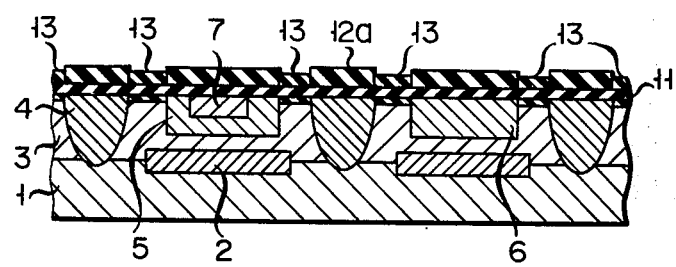

A second insulation film 13 is then formed on the exposed portions of the first insulation film 11 as shown in FIG. 1F. It is preferred that the second insulation film 13 be formed of a silicon dioxide film about 5000 to 6000 Å thick resulting from the heating at about 1100° C. for 3 hours in a mixed gas stream consisting of hydrogen gas, oxygen gas and a gas of a halogen-containing compound such as hydrogen chloride or trichloroethylene. In this oxidation step, the silicon nitride film 12a performs a masking function and, thus, oxidation does not take place on and beneath the film 12a. In other words, the second insulation film 13 is formed selectively. Incidentally, the oxidation takes place in this case beneath the exposed portions of the first insulation film 11, i.e., within the collector region as well.

The formation of portions of the silicon dioxide film 13 within the collector region by this selective oxidation serves to prevent the channel generation which would otherwise be caused by a decreased concentration of the impurities around the surface of the base region 5. Also, local variations in resistance of the resistance region 6 can be prevented by the selective oxidation. It is also important to note that the presence of the relatively thick insulation film 13 on the collector region serves to prevent the inversion of the collector region which would otherwise be caused by the voltage of the power source for operating the semiconductor device.

Figure 1G:
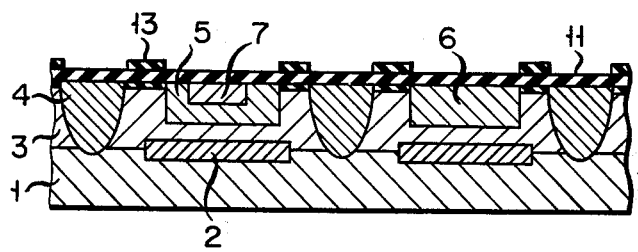
Figure 1H:
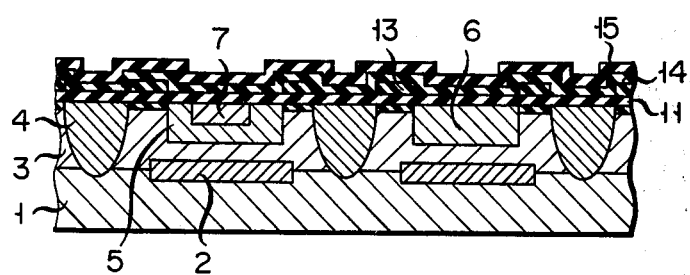

The silicon nitride film 12a is then removed by photo-etching using phosphoric acid or by plasma etching using tetrafluoromethane as shown in FIG. 1G. Further, a silicon dioxide film 14 about 2000 to 4000 Å thick is formed by chemical vapor deposition method utilizing oxidation of monosilane. Still further, a silicon dioxide film 15 doped with phosphorus or phosphorus-arsenic is formed about 2000 to 3000 Å thick over the film 14 by oxidizing monosilane in the presence of phosphorus or a mixture of phosphorus and arsenic as shown in FIG. 1H. It should be noted that the doping of phosphorus or phosphorus-arsenic serves to improve the passivation effect of the silicon dioxide film. Usually, phosphorus is doped in a concentration of $8 \times 10^{20}$ to $2 \times 10^{21}$ atoms/cm$^3$. Up to the same concentration arsenic can be doped.

Figure 1I:
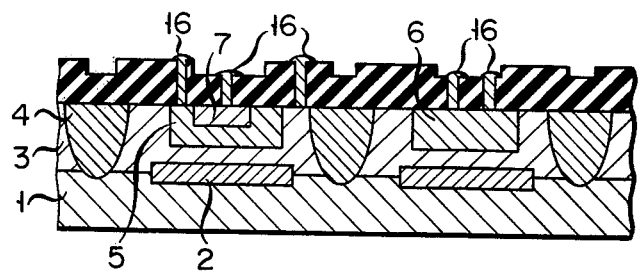

After the doped film 15 has been formed, annealing is effected for about 10 minutes at about 1000° C. under an oxidative or non-oxidative atmosphere. Then undesired impurities are removed by washing with phosphoryl chloride (POCL$_3$). Finally, the silicon dioxide films are selectively etched away to expose predetermined portions of the semiconductor substrate. A metal layer, such as an aluminum layer, is then deposited and an electrode 16 is formed by selectively photo-etching the metal layer as shown in FIG. 1I.

Figure 2:
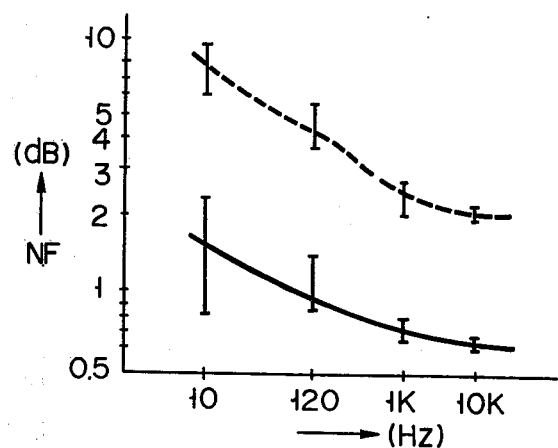
FIG. 2 is a graph showing the noise generation states for both the transistor produced by the method of this invention and that produced by the prior art method.

FIG. 2 shows the noise generation states for both a transistor produced by the method described and that produced by the prior art method, namely, the transistor retaining the silicon dioxide film used as a mask in the step of forming semiconductor regions. In FIG. 2, the ordinate represents the noise factor NF in decibel dB, with the abscissa denoting the frequency Hz. The solid line relates to the case of this invention and the broken line the case of the prior art method. The values plotted in FIG. 2 were obtained under the conditions wherein the collector current $I_C$ was 100 μA; the voltage between the collector and emitter $V_{CE}$ was 3 V; and the signal source resistance Rg was 1 kΩ. FIG. 2 clearly shows a big advantage of this invention over the prior art in terms of 1/f noise generation.

Figure 3:
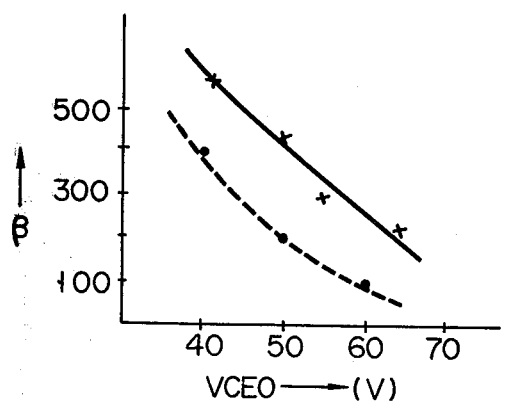
FIG. 3 is a graph showing the withstand voltages between the collector and the emitter for both the transistor produced by the method of the invention and that produced by the prior art method.

FIG. 3 shows the relationship between the current amplification factor $\beta$ and the withstand voltage $V_{CEO}$ between the collector and emitter for both the transistor produced by the method described and that produced by the prior art method. The solid line represents the case of this invention and the broken line denotes the prior art method case. FIG. 3 clearly shows that the transistor produced according to this invention is remarkably higher in withstand voltage $V_{CEO}$ than the one produced by the prior art method. It follows that the transistor produced in accordance with this invention permits a flow of a markedly small amount of generation-recombination current on the surface of the semiconductor region, compared with the transistor produced by the prior art method.

As described in detail, the method of this invention comprises the steps of forming a clean oxide film on the surface of the semiconductor substrate having desired semiconductor regions formed therein in advance, and selectively oxidizing the predetermined portion of the semiconductor substrate using a silicon nitride film as the mask. A semiconductor device thus produced is enabled to be low in noise generation and prominently high in withstand voltage.

The foregoing description relates to an embodiment of applying this invention to the production of a transistor in an IC device. But, this invention can be applied extensively to the production of semiconductor devices including, for example, diodes, thyristors, FET's, etc.

What we claim is:

1. A method of producing a semiconductor device, comprising the sequential steps of:
   forming desired semiconductor regions in a silicon semiconductor substrate selectively using masking films;
   removing all of the masking films used in forming the desired semiconductor regions in the semiconductor substrate to expose the entire surface of the semiconductor substrate;
   forming a first silicon dioxide insulation film on the exposed surface of the substrate;
   selectively forming a silicon nitride film on the surface of the first insulation film to provide covered and uncovered portions of the first insulation film, said covered portions being over predetermined semiconductor regions; and
   selectively forming a second silicon dioxide insulation film on the uncovered portions of the first insulation film and into the underlying semiconductor substrate beneath the uncovered portions adjacent the previously-formed predetermined semiconductor regions by using the selectively formed silicon nitride film as an oxidation mask on the covered portions of the first insulation film.

2. A method according to claim 1, wherein the step of selectively forming the silicon nitride film includes forming a continuous silicon nitride film over the entire surface of the first insulation film by chemical vapor deposition comprising reacting monosilane with ammonia, and subsequently selectively removing portions of the continuous silicon nitride film by etching to provide the uncovered portions of the first insulation film.

3. A method according to claim 2, wherein the etching of the silicon nitride film is carried out using phosphoric acid etchant.

4. A method according to claim 2, wherein the etching of the silicon nitride film is carried out by plasma etching using tetrafluoromethane.

5. A method according to claim 1, wherein the first silicon dioxide insulation film is formed by heating the semiconductor substrate in a mixed gas stream comprising hydrogen gas, oxygen gas, and a gas of halogen-containing compound.

6. A method according to claim 5, wherein the halogen-containing compound is hydrogen chloride or trichloroethylene.

7. A method according to claim 1, wherein the second silicon dioxide insulation film is formed by heating the substrate under an oxidative atmosphere.

8. A method according to claim 7, wherein the oxidative atmosphere comprises a mixed gas of hydrogen gas, oxygen gas and a gas of a halogen-containing compound.

9. A method according to claim 8, wherein the halogen-containing compound is hydrogen chloride or trichloroethylene.

10. A method according to claim 1, wherein the desired semiconductor regions formed in the substrate include a base region and emitter region, and wherein the silicon nitride film is selectively formed on portions of the first silicon dioxide insulation film at least over the base and emitter regions.

11. A method according to claim 10, wherein the desired semiconductor regions formed in the substrate include collector regions, wherein the uncovered portions of the first insulation film extend over the collector regions, and wherein the second insulation film selectively formed into the underlying semiconductor substrate lies in the collector region adjacent the base region.

12. A method according to claim 1, wherein all of the masking films used in forming the desired semiconductor regions are removed by etching.

13. A method according to claim 1, wherein the first silicon dioxide insulation film has a thickness of about 1500 Å.

14. A method of producing a semiconductor device, comprising the steps of:

forming desired semiconductor regions in a silicon semiconductor substrate selectively using masking films;

removing all of the masking films used in forming the desired semiconductor regions within the silicon semiconductor substrate to expose the entire surface of the substrate;

heating the silicon substrate in a mixed gas stream consisting of hydrogen gas, oxygen gas and a gas of a halogen-containing compound to form a first silicon dioxide film on the exposed surface of the silicon substrate;

effecting a reaction between monosilane and ammonia to form a silicon nitride film on the surface of the first silicon dioxide film;

selectively etching the silicon nitride film to leave predetermined portions of the nitride film thereby to provide covered and uncovered portions of the first silicon dioxide film at predetermined locations;

heating the substrate in a mixed gas stream comprising hydrogen gas, oxygen gas and a gas of a halogen-containing compound to form a second silicon dioxide film selectively on the uncovered portions of the first silicon dioxide film and extending into the underlying substrate of the uncovered portions, the remaining predetermined portions of the silicon nitride film acting as an oxidation mask in the selective formation of the second silicon dioxide film;

removing the remaining predetermined portions of the silicon nitride film to expose the portions of the first silicon dioxide film beneath said silicon nitride film;

forming a third silicon dioxide film covering both the second silicon dioxide film and the exposed portions of the first silicon dioxide film; and forming a silicon dioxide film doped with phosphorus or a mixture of phosphorus and arsenic on the third silicon dioxide film by oxidizing monosilane in the presence of phosphorus or a mixture of phosphorus and arsenic.

15. A method according to claim 14, wherein the semiconductor device is a transistor having collector, base and emitter regions.

16. A method according to claim 15, wherein the first silicon dioxide film is about 1500 Å thick.

17. A method according to claim 16, wherein the remaining predetermined portions of the silicon nitride film have a thickness of about 1000 Å and are located on portions of the first silicon dioxide film corresponding to the base and emitter regions.

18. A method according to claim 17, wherein the second silicon dioxide film is about 5000 to 6000 Å thick.

* * * * *